United States Patent [19]

Sevenhans et al.

[11] Patent Number: 5,471,168
[45] Date of Patent: Nov. 28, 1995

[54] QUALITY FACTOR TUNING SYSTEM FOR A TUNABLE FILTER AND CURRENT RECTIFIER USED THEREIN

[75] Inventors: Joannes M. J. Sevenhans, Prins Kavellei; Mark G. S. J. Van Paemel, De Hulsten, both of Belgium

[73] Assignee: Alcatel N.V., Amsterdam, Netherlands

[21] Appl. No.: 407,497

[22] Filed: Mar. 17, 1995

Related U.S. Application Data

[63] Continuation of Ser. No. 96,517, Jul. 23, 1993, abandoned.

[30] Foreign Application Priority Data

Jul. 24, 1992 [EP] European Pat. Off. ............... 92202292

[51] Int. Cl.$^6$ ................................................. H03B 5/00
[52] U.S. Cl. ........................... 327/553; 327/103; 330/305
[58] Field of Search ...................................... 330/300, 254, 330/109, 107, 301, 17.1, 17.4, 306, 305; 307/520, 521, 494; 328/167

[56] References Cited

U.S. PATENT DOCUMENTS

| | | | |
|---|---|---|---|
| 3,528,040 | 9/1970 | Galvin | 330/109 |
| 4,340,868 | 7/1982 | Pace | 330/109 |
| 4,823,092 | 4/1989 | Pennock | 330/300 |
| 4,868,516 | 9/1989 | Henderson et al. | 330/107 |
| 5,028,884 | 7/1991 | Kondo et al. | 330/107 |
| 5,063,309 | 11/1991 | Yamasaki | 302/521 |
| 5,124,593 | 6/1992 | Michel | 328/162 |

OTHER PUBLICATIONS

"An Elliptic Continuous–Time CMOS Filter with On–Chip Automatic Tuning" by Mihai Banu et al., IEEE Journal of Solid–State Circuits, vol. SC–20, No. 6, Dec. 1985, pp. 1114–1121.

"A CMOS Transconductance–C Filter Technique for Very High Frequencies" by Bram Nauta, IEEE Journal of Solid–State Circuits, vol. 27, No. 2, Feb. 1992, pp. 142–153.

"A 10.7–MHz CMOS OTA–R–C Bandpass Filter with 68 dB Dynamic Range and on–chip Automatic Tuning", M. Steyaert et al, ISSCC, Feb. 1992, pp. 66–67.

Primary Examiner—Timothy P. Callahan
Assistant Examiner—Dinh Le
Attorney, Agent, or Firm—Ware, Fressola, Van Der Sluys & Adolphson

[57] ABSTRACT

Based on the insight that the damping of a tunable filter is both related to its quality factor as to its passband gain, an inventive tuning system is proposed which tunes the quality factor of such a filter to a desired quality factor value by tuning the passband gain of the filter to a desired gain value. Such a tuning system is particularly useful in the field of OTA-C filters and consists of first (P1) and second (P2) tuning paths including such a tunable filter (BIQUAD) and fixed gain amplifiers (B-OTA1, B-OTA2). The gain of the latter amplifiers corresponds to the desired gain values. The tuning system further includes matching means (MM) for equalizing the gains in both tuning paths (P1, P2) by generating a quality factor tuning signal (VTQ) which is applied both to the tunable filter (BIQUAD) and to a replica thereof used as master filter in a data processing path. This matching means (MM) includes current rectifiers (C-REC1, C-REC2) implemented so as to use little hardware.

13 Claims, 4 Drawing Sheets

QUALITY FACTOR TUNING SYSTEM FOR A TUNABLE FILTER AND CURRENT RECTIFIER USED THEREIN

This is a continuation of application Ser. No. 08/096,517 filed on Jul. 23, 1993 and now abandoned.

CROSS-REFERENCE TO RELATED APPLICATION

This application discloses subject matter which may be disclosed and claimed in co-owned application U.S. Ser. No. 08/350,705 entitled "Frequency Tuning System For An OTA-C Pair", now U.S. Pat. No. 5,440,264.

TECHNICAL FIELD

The present invention relates to a tuning system for generating a tuning signal to be applied to a tunable filter in order to tune the quality factor of said filter to substantially equal a desired quality factor value, said tuning signal controlling the damping of said tunable filter.

BACKGROUND OF THE INVENTION

Such a quality factor tuning system is already known in the art, e.g., from the paper "A 10.7 MHz CMOS OTA-R-C bandpass filter with 68 dB dynamic range and on-chip automatic tuning", ISSCC February 1992, pp. 66–67, by M. Steyaert and J. Silva-Martinez. This paper more particularly concerns filters built with operational transconductance amplifiers (OTA's) and associated capacitances (C) which are commonly known as OTA-C filters. The use of this type of filter has proven to be particularly advantageous in the domain of integrated circuit analog filters. One of the advantages of such filters is derived from the controllability of the transconductances of the OTA's incorporated therein. Indeed, by tuning these transconductances the frequency response of the filter can be tuned. This tuning is primarily used to provide a very accurate frequency response in spite of inevitable implementation inaccuracies.

The present invention more particularly relates to a tuning system controlling such an OTA-C filter. It is to be noted that, although such a tuning system is not confined to the tuning of OTA-C filters but can be used in connection with any type of tunable filters, such OTA-C filters are the main application domain thereof. Therefore the tuning system will be further best described in connection with OTA-C filters.

Such tuning systems commonly operate according to the master-slave principle wherein at least one master filter included in a data processing path is tuned by a tuning signal, e.g. a tuning voltage for tuning a transconductance as mentioned above, generated by the tuning system which includes a replica of at least a section of this master filter. This replica is called a slave filter and corresponds to the above mentioned tunable filter. The tuning signal has to be so generated that the frequency reponse of the slave filter matches a desired response.

In the aforementioned document Steyaert et al it is proposed to determine this desired frequency response by tuning separately the quality factor of the total master filter and the time constant of the OTA-C integrators forming part of this filter. The former quality factor tuning is more particularly described in the section entitled "automatic tuning of the quality factor" and is the subject of the present invention. For the tuning of the time constant which is equivalent to a frequency tuning reference is made to the above-mentioned co-pending patent application of the same inventors as the present one, filed on even date herewith and entitled "Frequency tuning system for an OTA-C pair".

The quality factor of a filter is an important parameter as it determines for instance the bandwidth of the filter. In the known system use is made of the fact that the quality factor is correlated with the damping values of the circuit included in the filter. Hence, the quality factor is tuned by a tuning signal adjusting the resistances of the resistors included in the filter. For the generation of this tuning signal use is made of another well known fact in filter theory, namely that the shape of the transient response is determined by the quality factor. It is thus proposed to derive the tuning signal from the matching of the transient response of the tunable filter with a desired transient response.

The above described scheme indirectly tunes the filter's quality factor via its transient response. This scheme leads to a relatively long time delay for tuning the quality factor and furthermore requires relatively complex tuning circuitry as can be verified from the referenced document.

DISCLOSURE OF INVENTION

An object of the present invention is to propose a tuning system of the above known type but overcoming the mentioned shortcomings, i.e., which is simpler and generates the tuning signal relatively quickly.

This object is achieved due to the fact that a relation between said quality factor and the passband gain of said tunable filter allows determination of a desired gain value corresponding to said desired quality factor value, and that said tuning system adjusts said tuning signal until said passband gain substantially equals said desired gain value.

The invention is based on the insight that the damping of the filter is correlated with its quality factor as well as with its passband gain. Hence, this passband gain is also in some way related to the quality factor. The filter can then be so designed that this relation is known and relatively simple. This enables a tuning system to be designed making use of the latter relation in an inventive way. Indeed, providing the mentioned relation is known, the quality factor of the tunable filter may be derived from the measurement of the passband gain of this filter. Therefore, the tuning system advantageously only has to match the passband gain to the desired gain value corresponding to the desired quality factor value. This is achieved by adjusting the tuning signal which controls the damping of the filter and hence also its passband gain.

It can be easily verified that in this way the tuning system generates the required tuning signal faster than in the known tuning system owing to the fact that the measurement and control of the quality factor is more direct. Moreover, the proposed tuning system is simpler and hence also smaller, because the comparison of two gain values is more straightforward than the comparison of two transient responses. An additional advantage of this simple tuning system is that the tunable filter may be a replica of the whole master filter and not just of a section thereof as mentioned above. This is due to the fact that in a simple gain comparison the dimensions and the order of the tunable filter do not increase the design complexity of the tuning system. In this way, the master and the slave filter will be more accurately matched and the performance of the tuning system is improved.

Another aspect of the present invention is that said tuning system includes matching means for matching said passband gain to said desired gain value by adjusting said tuning signal so as to increase/decrease said passband gain if it is respectively lower/higher than said desired gain value.

From the above it can be clearly seen that the tuning system can be kept comparatively simple due to the fact that only gains have to be compared and matched. The above described negative feedback moreover ensures that the tuning is robust.

Still another aspect of the present invention is that said passband gain is the gain at a reference frequency within said passband, said tuning system including signal generator means generating a reference signal at said reference frequency, said reference signal being applied to first and second tuning paths of said tuning system, said first tuning path including a first amplifier and being connected to a first input of said matching means and said second path including at least said tunable filter and being connected to a second input of said matching means.

In this way, the tunable filter is tuned while operating in the frequency range of interest. This has the advantage that the tuning system takes into proper account the inevitable frequency dependent parasitical effects which are caused by the non-ideality of the devices used in the filter. Hence a more accurate tuning system is achieved in comparison with the one disclosed in the above document as no tuning mismatch is created due to the fact that the slave filter included in the tuning system is tuned in another frequency range than its corresponding master filter. Such a mismatch would otherwise be inevitable due to the mentioned frequency dependent parasitics included in every filter.

An advantageous feature of the present invention is that the second path further includes a second amplifier, the desired gain value being substantially equal to the ratio of the gains of the first and the second amplifiers.

Dependent upon the desired gain value required in a specific embodiment, e.g., when it is close to unity, such a gain could be more reliably achieved as a ratio of gains than as an absolute gain of a single first amplifier. Moreover, as such amplifier gains can be commonly achieved with appropriate resistors, especially in integrated circuit design, and as such resistors can only be implemented with a large relative precision, the fact of including a second amplifier and realizing the desired gain as a gain ratio again enhances the accuracy of the tuning system.

Another characteristic feature of the present invention is that the first and second tuning paths perform a voltage to current conversion, that the output currents of the tuning paths are further converted to first and second single ended and rectified currents by respective first and second current rectifiers included in the matching means, and that the rectified currents charge and discharge a capacitor also included in the matching means, the one of the tuning paths charging the capacitor being determined in such a way that the voltage over the capacitor can be used for determining the tuning signal.

It can be verified that with such very simple circuitry the voltage of the capacitor is a measure of the gain difference between the first and second tuning paths. The tuning path corresponding to the charging rectified current can be so chosen that the resulting voltage of the capacitor already constitutes the required negative feedback tuning signal. Furthermore, due to the current rectification, the unavoidable ripple on this voltage will verifiably have a much larger signal frequency than the above mentioned reference frequency and will therefore be located outside the passband range. Leakage of this ripple to the master filter or to the tunable filter will thus in practical circumstances not disturb the frequency response thereof. However, to be on the safe side, it is possible to low pass filter the tuning signal with a non-critical low pass filter. Such a low pass filter is in fact already achieved as a parasitic effect by the signal transmission lines in integrated circuits.

Another characteristic feature of the above tuning system is that the tunable filter includes at least one operational transconductance amplifier with an associated capacitance coupled to the outputs of the amplifier and in that the transconductance of the amplifier is so tuned that the amplifier-capacitance pair is tuned to a desired characteristic integrator frequency, and that the controllable damping is constituted by resistive means connected in parallel to the capacitance.

The above mentioned characteristic integrator frequency is, as is well known in OTA-C filter theory, the ratio of the transconductance to the capacitance value of the associated capacitor.

As mentioned above such filters are particularly advantageous and allow an easy tuning of the other basic characteristic of the filter, e.g., the center frequency of a bandpass filter which depends on this characteristic integrator frequency. The latter frequency tuning is explained in detail in the above mentioned co-pending patent application of filed on even date herewith.

Other features of the present invention are that each of the resistive means is also an operational transconductance amplifier, the damping being controlled via the tuning signal by controlling the transconductance of the operational transconductance amplifier and that the damping transconductance may be controlled so as to be negative.

Not only is it advantageous to use the same, easily tunable, technology for the resistive means but as this resistive means is an active amplifier element it can even be tuned to cancel out the inevitable parasitic damping. In this way, the quality factor can be lifted above the intrinsic limitations set by the design technology via the inclusion of a controlled negative resistance. This negative resistance is obtained by controlling the transconductance of the active element to be negative, i.e. so that this active element supplies energy to the filter, As a preferred embodiment of the present invention, the tunable filter consists of an input operational transconductance amplifier whose outputs are connected to a first capacitance and a first damping operational amplifier and the outputs of the tunable filter and the outputs of the first damping operational transconductance amplifier, that the last mentioned outputs are further connected to a first filter operational transconductance amplifier whose outputs are in turn connected to a second capacitance, a second damping operational transconductance amplifier and to the outputs of the last mentioned amplifier, and that the last mentioned outputs are connected to a second filter operational transconductance amplifier whose outputs are the outputs of the tunable filter, the damping amplifiers being tuned by the tuning signal and the input and filter amplifiers being tuned via a reference frequency tuning signal so as to ensure that the transconductance of the input amplifier is substantially proportional to the equal transconductances of the filter amplifiers.

The above defined biquadratic filter is so designed that the relation between the passband gain and the quality factor is a simple proportionality constant. This relatively simple relation is inventively procured for the known biquatradic filter section by tuning the input OTA with the same frequency tuning signal as the filter OTA's. The latter fact will be explained in detail later as will be the fact that such a filter may also be more reliably tuned owing to the mentioned common tuning of the input and filter OTA's.

A further advantage of the latter filter is that due to the inventive features described above it may use as its only building blocks identical OTA's and capacitances which makes it easy to integrate on an electronic chip.

The present invention also relates to a current rectifier for converting two balanced input currents to a single ended rectified current.

Such a current rectifier is particularly but not exclusively a basic building block of the tuning system described above.

Correspondingly, a further object of the present invention is to propose a current rectifier of the above type with very little hardware cost.

The above object is achieved due to the fact that the current rectifier includes first and second switching paths to transfer towards a rectifier output the highest and the lowest of the two balanced currents a respectively, the rectified current then provided at the rectifier output being substantially equal to the absolute value of a differential current resulting from the subtraction of the highest and lowest currents.

In using such a current rectifier which produces a balanced to single ended rectified current conversion as for instance needed in the above tuning system, a very simple and efficient solution is achieved for this rectification. The single ended rectified current which is the absolute value of the differential current, for instance produced by an operational transconductance amplifier, can be so achieved using advantageously little hardware in an inventive Nay compared to known schemes wherein first the single ended current is derived from the differential current whereafter this single ended current is rectified.

Other characteristic features of such a current rectifier are that the two balanced currents are provided at respective first and second input terminals and that the first and the second switching paths respectively include a first and a second switching means and that both the first and the second switching means are coupled to both the first and second input terminals for diverting the highest and lowest currents to the first and second switching paths, respectively, both the switching means being controlled via a control signal dependent upon the sign of the differential current, that each of the switching means consists of first and second switches for coupling the first and the second input terminals to the first and second switching paths respectively, that the control signal is generated by a differential amplifier arrangement having first and second control inputs connected to the first and second input terminals respectively, and that the control signal controls the first switch of the first switching means and the second switch of the second switching means complimentarily with the second switch of the first switching means and the first switch of the second switching means and that the first switching path includes a current mirror circuit.

In this way a very simple active rectifier is provided using little hardware to carry out the above inventive aspect of the present invention.

This embodiment of the rectifier does not produce an exact rectified current due to non-ideality of the switches included therein. However, such exactness is for instance not required in the above described tuning system and is in fact advantageous as it pushes the ripple on the tuning signal to an even higher frequency range so avoiding disturbance on the tunable filter and the master filter.

The above embodiment moreover allows the current rectifier to be advantageously simply altered to produce a rectified current of a particular sign as for instance needed in the above described tuning system in order to provide both a charging and a discharging rectified current. Indeed, as can be easily verified, including the current mirror means in either the first or the second switching path leads to a rectified current respectively "entering" or "leaving" the current rectifier which is equivalent to the need for rectified currents of opposite signs. As such opposite signs can thus be very simply achieved by only changing the interconnection in the switching means, the design effort for both rectifiers can be kept at a minimum.

Also an important feature of the above tuning system is that said current rectifiers are of one of the types described above.

These and other objects, features and advantages of the present invention will become more apparent in light of the following detailed description of a best mode embodiment thereof, as illustrated in the accompanying drawing.

BEST MODE FOR CARRYING OUT THE INVENTION

Figure 1:
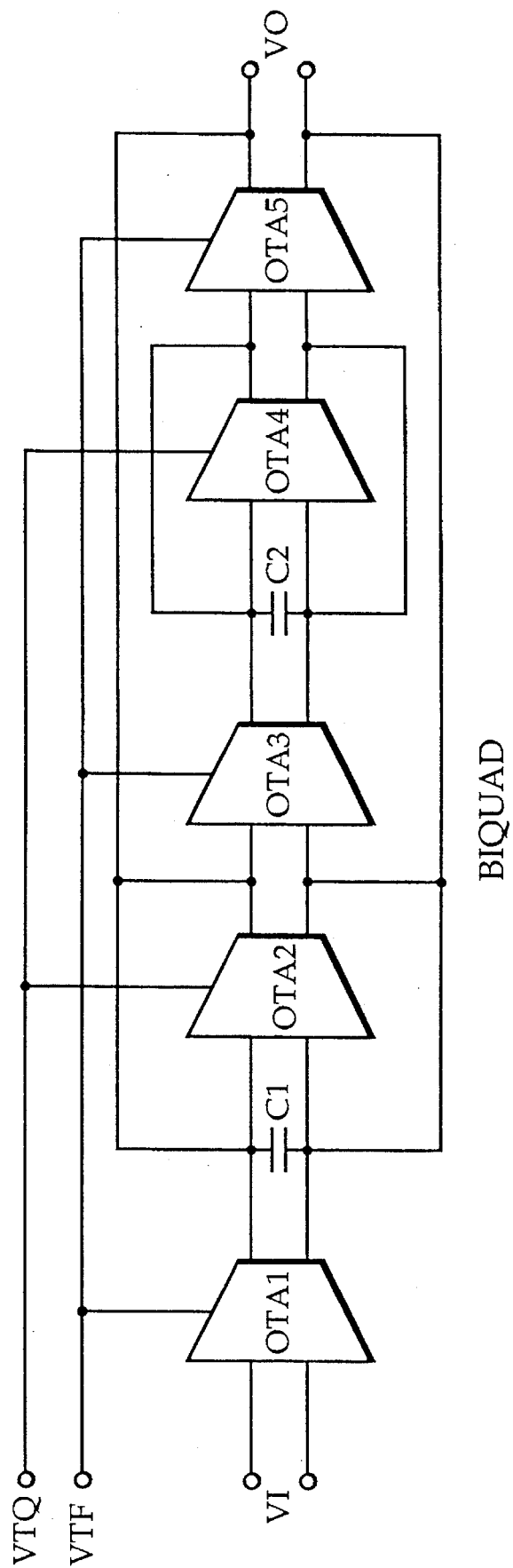
FIG. 1 shows a biquadratic filter BIQUAD adapted to be tuned with a tuning system according to the present invention.

The tunable biquadratic filter BIQUAD shown in FIG. 1 is an analog continuous time filter implemented by amplifier-capacitor pairs each pair including an operational transconductance amplifier, henceforth generally indicated by the prefix OTA, and a capacitance, henceforth generally referenced with the prefix C. Such OTA-C pairs form the basic building block of the well known OTA-C filter topology and these pairs are nothing else than classical basic integrators. OTA-C filters are recognized for their advantageous properties and are therefore widely used in analog on-chip filtering e.g. in the mobile communications field. A particular advantage of this type of filter is that it can be easily tuned by tuning the transconductances of the OTA's included therein. This tuning is critical for achieving satisfactory performance in spite of implementation inaccuracies.

In the above mentioned paper it is disclosed that the frequency response of such an OTA-C filter can be tuned to a desired response by two separate tuning systems. A first tuning system generates a frequency tuning signal for the transconductances of the OTA's included in the aforementioned integrators and a second tuning system generates a quality factor tuning signal tuning the damping of the filter so as to achieve a desired quality factor value for this filter as will be described below.

It is to be noted that a particular frequency tuning system is the subject of the co-pending patent application filed on even date, from the same inventors and entitled "Frequency tuning system for an OTA-C pair".

Figure 5:
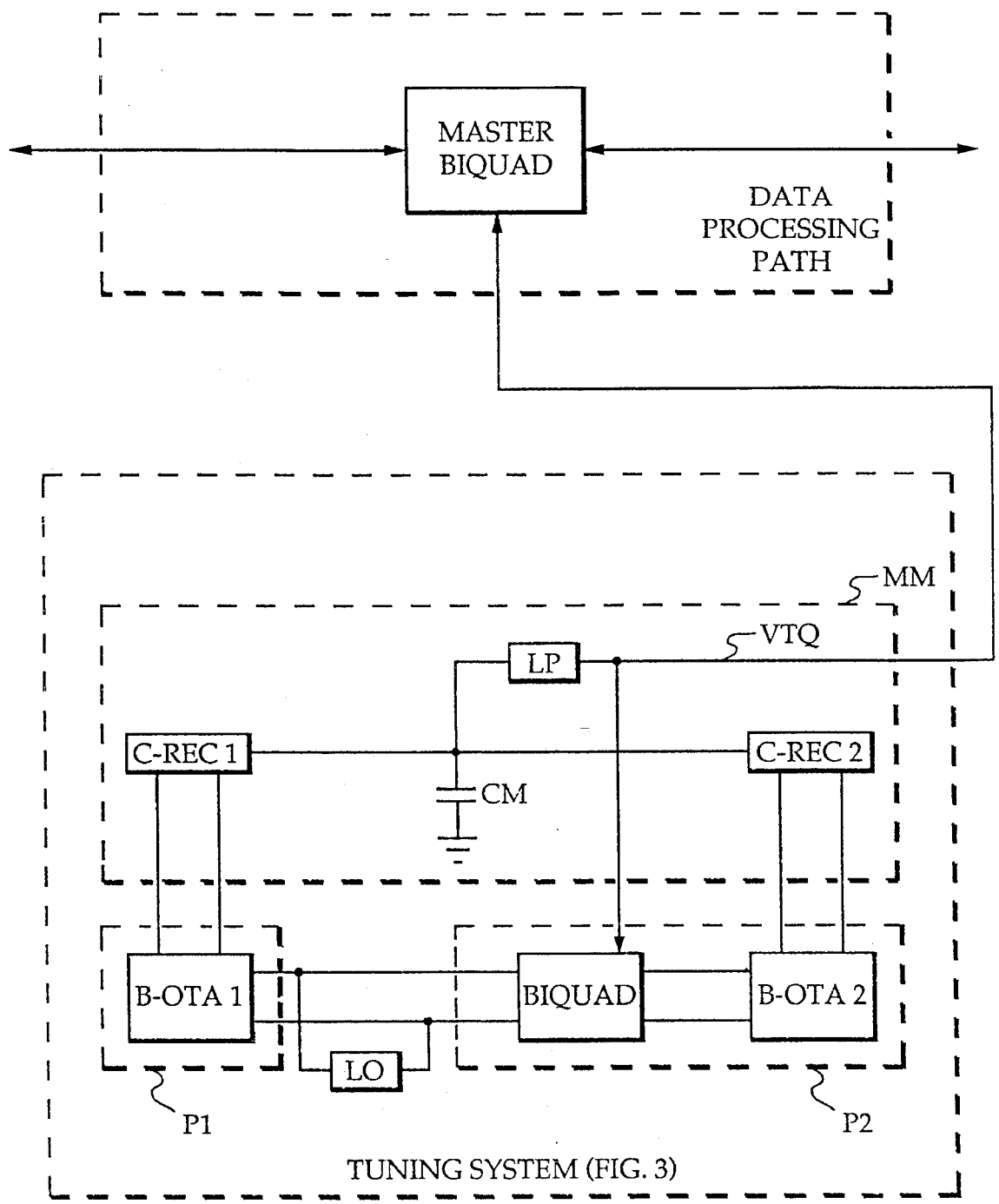
FIG. 5 shows a master biquadratic filter in a signal processing path which is tuned by a quality factor tuning signal provided by the quality factor tuning system of FIG. 3.

Such tuning systems commonly operate according to the master-slave principle. This means that the above mentioned tuning signals are applied to at least one filter included in a data path for processing information data and called "master" filter, whilst the tuning system itself includes a replica of at least a part of this master filter, which replica is called "slave" filter. The slave filter is then used by the tuning system as a reference for producing the tuning signal. In the presently described quality factor tuning system the master and the slave filter are both the same as the filter BIQUAD shown in FIG. 1. As shown in FIG. 5, the master biquad filter is part of a data processing path and is Q-tuned by the VTQ signal of the tuning system of FIG. 3, as is the slave biquad. It is further common practice to integrate the tuning system and the master filter on a same electronic chip to improve the tuning accuracy and that practice may be followed here as well to further advantage.

It is however to be noted that the quality factor tuning system according to the present invention, while being particularly advantageous in conjunction with the aforementioned OTA-C filter type, is equally well applicable to other filter types. Indeed, as will become clear later, this tuning system makes use of a relation between the passband gain G and quality factor Q and this relation is quite natural for any type of filter. Indeed, since it is well known in filter theory that the quality factor is determined by the damping and since obviously this damping is nothing else than the dissipation of energy in the filter and hence a loss of gain, there is a relation between the gain and the quality factor. In order to use a tuning system according to the present invention it is thus sufficient to design a tunable filter in which the above mentioned relation is known and possibly simple. Such a filter implemented with OTA-C integrators as mentioned above is depicted in FIG. 1 and described hereafter. As will be explained later, the quality factor of this filter is proportional to the gain at a reference frequency in the passband frequency range of the filter. More particularly, in the following description the tunable filter is a passband filter and the reference frequency is substantially equal to the center frequency of this bandpass frequency range.

The filter shown in FIG. 1 is a biquadratic filter BIQUAD comprising 5 operational transconductance amplifiers OTA1, . . . , OTA5 and 2 capacitors C1, C2. The filter BIQUAD has differential voltage input terminals VI to which like named signals VI are applied and produces a filtered differential output voltage VO across like named voltage output terminals VO. It has to be noted that all the intermediate signals in BIQUAD are balanced signals differentially applied on two corresponding terminals and that the constituent parts of BIQUAD operate on these differential signals. This will be implicitly understood throughout the following.

The voltage input terminals VI are connected to the inputs of an input transconductance amplifier OTA1 determining the passband gain G of the filter. Across the output terminals of OTA1 a first capacitor C1 is connected and the latter output terminals are further also connected to both the input terminals of a first damping operational transconductance amplifier OTA2 as well as to the voltage output terminals VO. The output terminals of OTA2 are connected both to the output terminals of OTA1, i.e. also to the voltage output terminals VO, and to the input terminals of a first filter operational transconductance amplifier OTA3. Across the output terminals of OTA3 a second capacitor C2 is connected and the latter output terminals are further connected to a second damping operational transconductance amplifier OTA4. The output terminals of OTA4 are connected both to the output terminals of OTA3 and to the input terminals of a second filter operational transconductance amplifier OTA5 whose output terminals are the output terminals VO of the filter BIQUAD.

By modifying their transconductance, OTA2 and OTA4 produce a controllable damping. This damping is tuned by a quality factor tuning voltage VTQ provided at a like named tuning terminal VTQ connected to both OTA2 and OTA4. The generation of the latter tuning voltage VTQ is the subject of the present invention.

OTA3, OTA5, C1 and C2 perform the actual filtering and the transconductances of OTA3 and OTA5 are tuned by a frequency tuning voltage VTF provided at a like named tuning terminal VTF of BIQUAD and connected to OTA3, OTA5 and to OTA1. It is well known that the pairs OTA3-C1 and OTA5-C2 constitute integrators. The frequency tuning system tunes via the above transconductances the corresponding characteristic integrator frequencies to a desired value, the latter characteristic frequencies being nothing else than the ratio of the transconductances to the capacitance values of the associated capacitors. These characteristic frequencies together determine the above mentioned center frequency of the bandpass filter BIQUAD as explained below. As already mentioned, OTA1 is also controlled by the frequency tuning voltage VTF, the reasons therefore will be clarified later. It is to be noted that VTF and VTQ together tune the filter BIQUAD to have the above mentioned desired frequency response.

Figure 2:
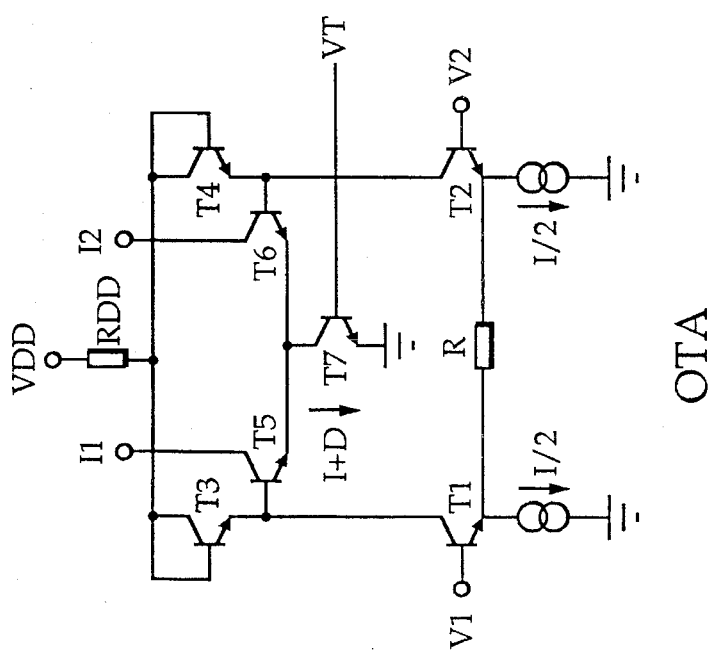
FIG. 2 shows an operational transconductance amplifier OTA which is used in the blocks OTA1–5 of the filter BIQUAD shown in FIG. 1.

It is further to be noted that OTA1, . . . , OTA5 each correspond to a same building block depicted in more detail in FIG. 2 and generally referenced to as an operational transconductance amplifier OTA. By using the operational transconductance amplifiers OTA2 and OTA4 to provide the controllable damping, two intrinsic advantages are procured for the BIQUAD. Firstly, integration on an electronic chip is easier as less distinct building blocks have to be designed, and secondly, conceiving the damping by means of active elements allows to introduce energy via this damping so counteracting the dissipation in the inevitable parasitic damping and hence also allowing to boost the quality factor above limitations set by this parasitic damping. The latter is equivalent to the inclusion of negative resistances which means that the transconductances are also made negative i.e. that OTA2 and OTA4 supply energy to BIQUAD. It is to be noted that a detailed description of OTA will be given later by making reference to FIG. 2.

In denoting the transconductance of OTA1, . . . , OTA5 with gm1, . . . , gm5 respectively, the operation of the filter BIQUAD will hereafter be described in detail. Firstly, in order to maximize the dynamic range, C1 and C2 are implemented as capacitors having an equal capacitance value C. In this way, all signals appearing in the filter BIQUAD will have similar amplitudes so avoiding that the dynamic range would be restricted by non-linear effects in a filter part with higher amplitude. Furthermore, the design of the filter BIQUAD is simpler when implementing OTA3 and OTA5 to have an equal transconductance, i.e. gm3=gm5= gmr where gmr denotes each of the integrator's transconductance since OTA3 and OTA5 can be seen as forming part of an integrator as mentioned above. Similarly, OTA2 and OTA4 are implemented so as to have equal transconductances, i.e. gm2=gm4=gmd where gmd denotes the damping transconductance. The latter equalities still hold in tuning the respective transconductances since OTA2 and OTA4 are both controlled via VTQ while OTA3 and OTA5 are both controlled via VTF.

With the above considerations in mind it can be verified that the transfer function of the filter BIQUAD can be written in the Laplace domain as:

$$\frac{V0}{VI} = a(s+b) / \left( \frac{s^2}{W0^2} + \frac{Z}{W0} s + J \right) \qquad (1)$$

In formula (1) the different coefficients a, b, WO, Z and J are related to the above defined parameters of BIQUAD in the following way:

$$a = \left( \frac{C}{gmr} \right)^2 \frac{gm1}{C} \qquad (2)$$

$$b = \frac{gmd}{C} \qquad (3)$$

$$W0 = \frac{gmr}{C} \qquad (4)$$

$$Z = 2 \cdot \frac{gmd}{gmr} \qquad (5)$$

$$J = \left( \frac{gmd}{gmr} \right)^2 - 1 \qquad (6)$$

From well known theorems of analog filter theory the above coefficients can be interpreted as described hereafter. It is however first to be noted that the following formulas are only valid if the quality factor Q of BIQUAD is relatively large, e.g., larger than 10. The latter fact however is not a restriction upon the theories described hereafter and is only made for clarity's sake. It has further to be noted that in the following the word frequency will be undistinguishably used either to denote a frequency or to denote a corresponding pulsation to which the frequency is related via the constant 2Pi as generally known.

The characteristic frequency of the resonator consisting of OTA3, OTA5 and C1, C2 is WO and it can be verified that this WO is also the characteristic integrator frequency mentioned above to which both pairs OTA3-C1 and OTA5-C2 should be tuned. In the above mentioned co-pending patent application the transconductance gmr is so tuned via VTF so as to achieve this desired WO and, as will become clear later, this desired WO is further related to the desired center frequency for the bandpass filter BIQUAD. Hence, in tuning the above OTA-C pairs in this way, the desired center frequency for the bandpass filter BIQUAD is achieved. This center frequency is indeed given by $$Wc = W0 \sqrt{J} . \qquad (7)$$

The normalized bandwidth of the bandpass filter BIQUAD is given by Z and is also the reciprocal of the quality factor Q.

A last parameter of interest is the passband gain at the aforementioned center frequency which is given by the following formula:

$$G = \frac{gm1}{2gmd} \qquad (8)$$

From the above it follows that the ratio of the passband gain G, given in formula (8), and the quality factor Q, which reciprocal is given in formula (5), conforms to the following relationship:

$$\frac{G}{Q} = \frac{gm1}{gmr} \qquad (9)$$

The above relationship, derived for the specific filter BIQUAD described herein as preferred embodiment, is inventively used in the quality factor tuning system shown in FIG. 3 which will be described later. It allows a measurement of the quality factor Q by simply measuring the passband gain G of the slave filter BIQUAD included in the tuning system and allows this quality factor to be tuned to a desired value by tuning the passband gain so as to achieve a corresponding desired gain value. Indeed, the parameters gm1 and gmr on the right hand side of formula (9) are known from design calculations carried out on BIQUAD and the gain is tuned via VTQ by influencing gmd as will be described later.

It has to be noted that, in theory, a relationship as formula (9) can be calculated for any tunable filter whereafter it can be tuned via the inventive tuning system here described.

The tuning system can even be further simplified and provides a better performance if, as already mentioned and depicted in FIG. 1, OTA1 is also controlled by VTF. Indeed in this case gm1 is always substantially equal to gmr times a predetermined porportionality constant and the latter constant is nothing else than the fixed ratio between the gain G and the quality factor Q. It will become apparent from the description of the OTA shown in FIG. 2 that such a proportionality constant is the ratio of two resistances and, as it is well known, such a ratio can be obtained with a great accuracy when these resistances are implemented on an electronic chip.

In this way also it is avoided that unknown parasitic effects and implementation tolerances would render formula (9) inapplicable as these effects would make the value of gm1 not only unknown but even variable wherefore the ratio of the gain on the quality factor would be unknown and no way would exist to derive from a desired quality factor value a sufficiently reliable corresponding desired gain value.

In summarizing it can be said that in tuning gmr with VTF to equal a calculated gmr, in tuning gm1 also with VTF, and finally in tuning gmd so that the passband gain G at the center frequency, say We, equals a desired gain value, the BIQUAD will have a desired calculated frequency reponse.

According to another inventive aspect of the present invention a linear and tunable OTA used in OTA1, . . . , OTA5 will now be described in detail with reference to FIG. 2. A large number of such OTA's are known from the litterature and can all be used in conjunction with the present invention but the OTA described hereafter is particularly advantageous, wherefore it will be used in the preferred embodiment of the present invention.

The linear and tunable bipolar OTA depicted in FIG. 2 has first and second differential voltage input terminals V1 and V2 on which like named voltages are applied respectively. OTA converts the latter voltages to first and second differential output currents I1 and I2 on like named current output terminals respectively. The latter conversion is characterized by the OTA's transconductance gm determining the differential output current to differential input voltage ratio. gm is tuned via a tuning input terminal VT on which a like named tuning input voltage is applied. VT might correspond to VTF as well as to VTQ according to the OTA's location the filter BIQUAD of FIG. 1.

OTA includes two parallel branches constituting an input stage coupled on the one hand to a first end of a resistor RDD whose second end is coupled to a power supply terminal VDD, and on the other hand to a ground terminal symbolically depicted in FIG. 2. A first branch consists of the series connection of a diode-connected npn transistor T3, an npn transistor T1 controlled via V1 and a symbolically represented current source producing a current I/2. Similarly, a second branch consists of a series connection of a diode-connected npn transistor T4, an npn transistor T2 controlled via V2 and a second symbolically represented current source also producing a current I/2. Each of the two mentioned current sources is coupled between the emitter electrode of T1/T2 and the ground terminal respectively. An emitter degeneration resistor R is further coupled between the emitter electrodes of T1 and T2.

The OTA further includes an output stage which is a bipolar differential pair consisting of three npn transistors T5, T6 and T7. T5 and T6 are the input transistors of this output stage and are controlled by the voltages appearing on the emitter electrodes of T3 and T4 respectively. The collector electrodes of T5 and T6 are connected to current output terminals I1 and I2 respectively, while their emitter electrodes are connected in common to the collector electrode of T7. T7 operates as a current source producing an amount of current controlled by the tuning voltage VT and its emitter electrode is connected to the ground terminal. The current produced by T7 and controlled via VT is indicated as I+D.

It can be easily verified that in a first approximation the overall transconductance gm of the OTA depicted in FIG. 2 can be expressed as:

$$gm = \frac{1}{R} \frac{I+D}{I} \quad (10)$$

where formula (10) is derived from the condition that the resistance of the resistor R is much larger than that of the resistances determined by transistors T1 and T2, i.e., larger than the reciprocal of their respective transconductances. The latter condition is in fact the condition that R strongly linearizes the input stage of OTA. Formula (10) can then further be interpreted as an input stage with a linearized gain equal to 1/R followed by an output stage, which is in fact similar to a known Gilbert gain cell, further amplifying the differential input signal with a factor (I+D)/I.

It is to be noted that diode-connected transistors T3 and T4 allow that the signal from the input stage is transferred to the output stage substantially without distortion as implicitly understood from formula (10). Indeed, it is well known in the art that the frequency dependent transconductance of T3 and T4 allows one to cancel the frequency dependent transconductance of the input transistors T5 and T6, respectively, of the output stage of OTA.

It is further clear that the transconductance gm of the OTA is in this way intrinsically inversely proportional to the resistance of R i.e., proportional—and for instance equal—to its conductance value. Hence, when such OTA's are integrated on an electronic chip the various transconductances can be realized with great relative precision if they are tuned with a same tuning voltage so that the factor (I+D)/I is substantially equal for all these various transconductances. Indeed, this relative precision is derived from the accuracy with which resistance ratios can be achieved on electronic chips.

As mentioned above, such large relative precision is particularly useful in the present invention as it allows gm1 and gmr to be proportional with great precision.

Now, with reference to FIG. 3, the actual tuning system in accordance with the present invention will be described in detail referring to the above.

Figure 3:
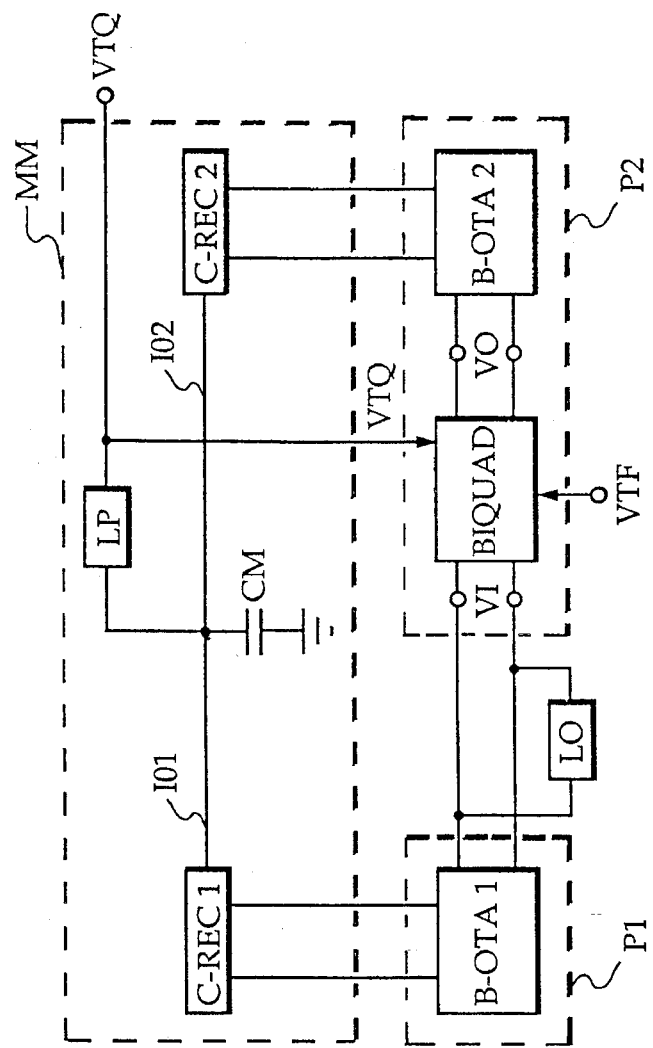
FIG. 3 represents a tuning system in accordance with the present invention for tuning the quality factor of the filter BIQUAD of FIG. 1.

The filter BIQUAD shown in the quality factor tuning system of FIG. 3 is tuned by a frequency tuning voltage VTF generated by a tuning system described in the mentioned co-pending patent application and by a quality factor tuning voltage VTQ generated by the tuning system of FIG. 3 itself in an inventive May as described below. As already mentioned, the filter BIQUAD included in this tuning system and shown is a slave filter which is a replica of at least one master filter (see FIG. 5) included in the data processing path.

The tuning system includes signal generator means LO oscillating at a reference frequency in the passband of the filter to be tuned, i.e., in this case at the reference frequency which is the center frequency Wc of the bandpass filter BIQUAD as calculated in formula (7). LO has a differential output voltage applied to the balanced input terminals of a first tuning path P1 and of a second tuning path P2. The first tuning path P1 consists of a balanced operational transconductance amplifier B-OTA1 which converts the differential input voltage to a differential output current with a fixed gain or transconductance. The input terminals of the second tuning path P2 are the input terminals VI of the filter BIQUAD and P2 further includes a second balanced operational transconductance amplifier B-OTA2 converting the differential voltage appearing across the output terminals VO of BIQUAD to a differential output current. As in the case of B-OTA1, B-OTA2 also has a fixed transconductance. The differential output currents of B-OTA1 and B-OTA2 are then converted to rectified single ended currents IO1 and IO2 by means of current rectifiers C-REC1 and C-REC2 respectively. The currents IO1 and IO2 are both applied to a common junction point to which a matching capacitance CM is also connected, the second end of CM being connected to the ground terminal. As clarified below, the rectified current IO1 always discharges CM while the rectified current IO2 charges CM.

The voltage appearing at the mentioned junction point is then low pass filtered via a low pass filter LP to produce the quality factor tuning voltage VTQ which is applied both to the slave filter BIQUAD in FIG. 3 and to the master BIQUAD filter shown in FIG. 5. C-REC1, C-REC2, CM and LP together form matching means MM, the current-to-voltage ratio or gain of the first P1 and the second P2 tuning paths being compared by means of the matching capacitance CM.

What in fact is represented in FIG. 3 is a simple and sufficiently accurate way of comparing the gains of P1 and P2. The gain of P1 is represented by the fixed transconductance of B-OTA1 while the gain of P2 is the product of the passband gain G of BIQUAD and the fixed transconductance of B-OTA2. The rectified current IO1 of the tuning path P1 discharges the matching capacitor CM, whereas the rectified current IO2 of the tuning path P2 charges this capacitor CM. If the gain of the charging path is larger than the gain of the discharging path the voltage over CM will increase and vice versa. In order to achieve a negative feedback this voltage at the junction of CM LP and the two rectifiers C-REC1, C-REC2, from which VTQ is derived, should always reduce the difference in gain between the two tuning paths P1 and P2, i.e., until this difference becomes zero, in which case the gain of P1 is equal to the product of the gain of P2 and the passband gain G. In other words, in this case G is equal to the ratio of the gains of P1 to P2.

It can be verified that by including BIQUAD in the discharging path such negative feedback is achieved. Indeed, if the gain of P2 exceeds the gain of P1, the voltage over CM will be increased. Hence also, VTQ will be increased and, as can be verified from the above description of OTA, the damping in the BIQUAD increases which leads to a decrease in the gain of P2 due to a loss of gain in this BIQUAD.

The voltage across CM can, however, never be tuned to an ideal steady state DC value. Indeed, any different phase lag in P1 and P2 results in IO1 and IO2 being out of phase. Hence, the difference between IO1 and IO2 can never be identically zero even when the amplitudes of IO1 and IO2 are equal. Such a characteristic for the voltage over CM is however sufficient to obtain a reliable quality factor as the ripple on this voltage has, due to the rectification and the nature of C-REC1 and C-REC2 as described below, a high harmonic content. This ripple can then be easily filtered out by the low pass filter LP or one can even rely upon the parasitic low pass filtering of the lines over which the tuning signal is transmitted towards the slave and master filter. In any case, the simplicity of the matching means MM presents advantages exceeding the minor drawback of not accomplishing a very accurate steady state.

Finally it is to be noted that the passband gain G of BIQUAD in the tuning system is very reliably tuned as the desired gain value, to which it is tuned, is a ratio of the gains of B-OTA1 on B-OTA2 where the latter gains are primarily determined by resistive values as will be clarified below with reference to FIG. 4.

Building blocks C-REC and B-OTA of a current rectifier and a balanced operational transconductance amplifier respectively will now be described in detail with reference to FIG. 4. These building blocks are used in the tuning system of FIG. 3 as C-REC1, C-REC2 and B-OTA1, B-OTA2, respectively.

The balanced operational transconductance amplifier B-OTA has differential voltage input terminals V11 and V12 on which like named voltages are applied. B-OTA converts these voltages V11 and V12 to first and second currents forming together balanced output currents. These first and second currents are then applied to first and second current input terminals of the current rectifier C-REC. According to another inventive aspect of the present invention, C-REC converts these currents to a single ended rectified current IO then available at a like named rectified current output terminal and which substantially equals the absolute value of the differential current present on its current input terminals. This rectified current IO has a predetermined sign, i.e. it is either always "leaving" C-REC or is always "entering" C-REC via the rectified current output terminal IO. However, in accordance with still another inventive aspect of the current rectifier C-REC, this sign is determined by a small portion of C-REC and the latter rectifier is thus well suited to provide either the charging or the discharging current needed in the quality factor tuning system described above by implementing it with a corresponding interconnection pattern as clarified below.

B-OTA includes two bipolar input transistors T11 and T12 controlled by the input voltages V11 and V12 respectively. The emitter electrode of T11/T12 is connected to a first end of a current source I11/I12 whose second end is connected to the ground terminal. Between these emitter electrodes an emitter degeneration impedance Z is coupled for determining the transconductance, and hence also the gain, of the B-OTA in the same way as the transconductance of the input stage of the aforedescribed OTA depicted in FIG. 2 was determined by the emitter degeneration resistance R. The collector electrodes of T11 and T12 constitute the above mentioned first and second current input terminals of the current rectifier C-REC, respectively.

C-REC includes first and second parallel branches coupled between a power supply terminal VDD and the mentioned first and second current input terminals respectively. The first branch includes the series connection of a first load resistor RDD1 and a diode-connected pnp transistor T17, the second branch includes the series connection of a second load resistor RDD2 and a pnp transistor T18, the base electrode of which is connected to the commoned base and collector electrodes of T17. The collector electrodes of T17 and T18 are coupled to both the first and the second current input terminal via first and second switching paths consisting of npn transistors T15/T16-T17-T18 and T13/T14, respectively. These first and second switching paths include, respectively, first T15, T16 and second T14, T13 switching means which in turn each include first T15, T14 and second T16, T13 switches, the latter switches being the four last mentioned npn transistors. The first T15 and the second T16 switch of the first switching means connect the first and the second current input terminal to the collector electrode of T17 respectively, while the first T14 and the second T13 switch of the second switching means connect the first and the second current input terminal to the collector electrode of T18 respectively. As a result, the collector electrode of T18 operates as a rectifying node and corresponds to the current output terminal IO of C-REC.

C-REC further includes a differential amplifier arrangement consisting of npn transistors T19 and T20, load resistors RDD3 and RDD4 and current source I13. The base electrodes of T19 and T20, which are respectively the first and second input terminals of this amplifier arrangement, are controlled from the first and second current input terminals of C-REC respectively.

Figure 4:
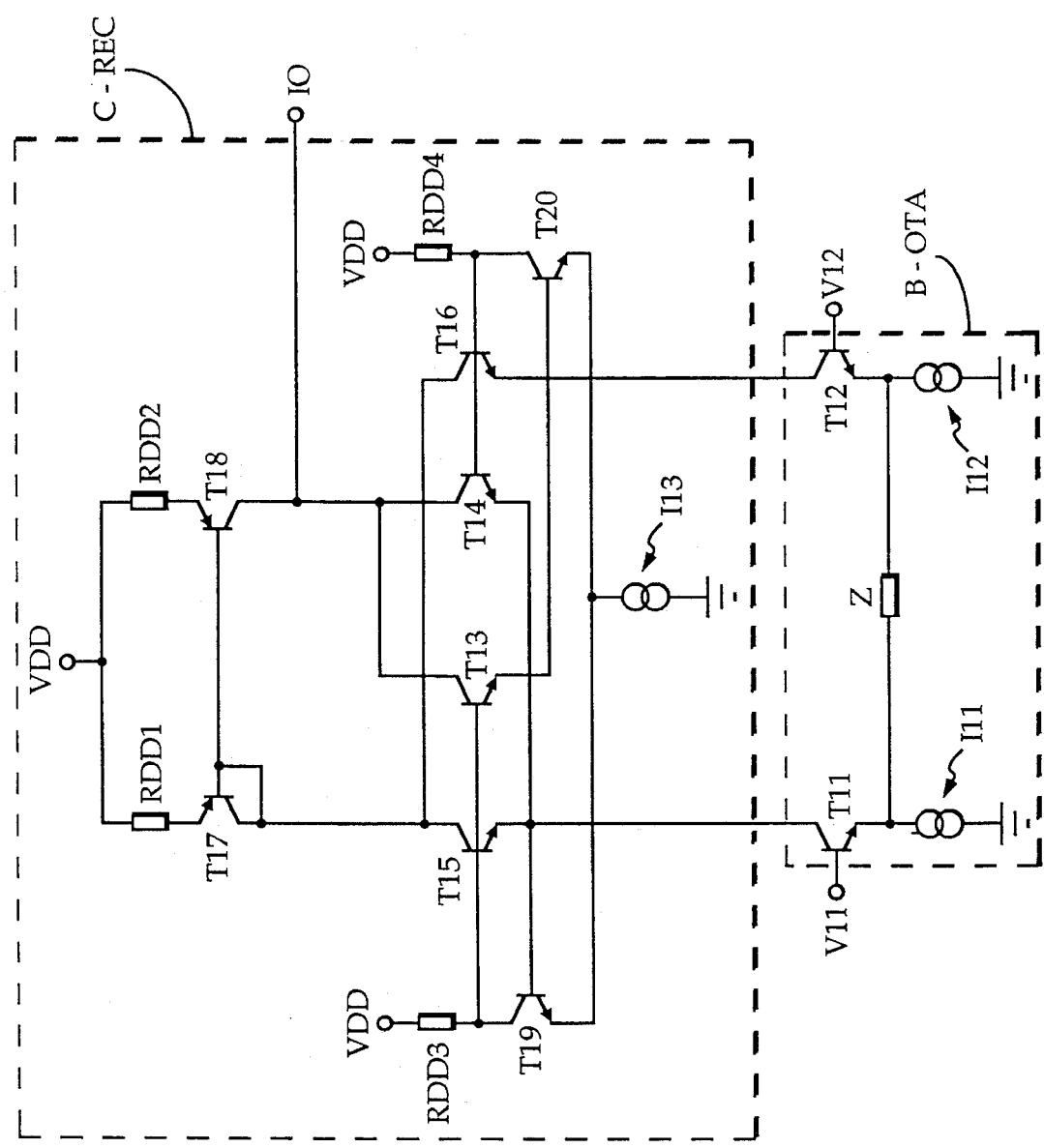
FIG. 4 shows in more detail a balanced operational transconductance amplifier B-OTA and a current rectifier C-REC used in the tuning system of FIG. 3.

From FIG. 4 it is clear that the first switching path towards the rectifying node IO is created via the main emitter-to-collector path of T15 or T16 and the current mirror circuit constituted by T17 and T18 and that a second switching path towards IO is also created via the main path of T13 or T14. It is further clear that both these switching paths can be taken by both the above two balanced currents.

B-OTA has a fixed voltage-to-current ratio or gain determined by the impedance Z whereby it provides the first and second currents corresponding to the gain needed in the above described tuning system.

These currents cause a voltage drop at the inputs of C-REC and the resulting voltages at the current input terminals of C-REC are amplified by the differential amplifier arrangement T19, T20, RDD3, RDD4 and I13. It can be verified that if the first current, i.e., the current at the first input terminal of C-REC, is the largest and the gain of the amplifier arrangement is large enough, switches T15 and T13 will be closed while switches T14 and T16 are open. The first and largest current will then reach the rectifying node IO via the mentioned first switching path, while the second and smallest current reaches IO via the second switching path. The subtraction of these two currents at IO then yields the differential current in the outgoing direction. Similarly, when the second current, i.e. the current at the second input terminal of C-REC, is the largest, it can be verified that it reaches IO via the first switching path through T16 while the first and smallest current reaches IO through T14. From the above it is clear that on the current output terminal IO the rectified differential current is present in the outgoing direction. It can be further easily verified that in including the current mirror circuit T17, T18 in the second instead of in the first swithing path, the same rectified current will be provided at IO in the incoming direction. The latter fact allows to similarly design both the discharging rectifier C-REC1 and the charging rectifier C-REC2 depicted in FIG. 3. The above active rectifier C-REC moreover uses very little hardware due to the fact that the rectification and the conversion to a single ended current are performed simultaneously.

It is finally to be noted that due to the non-ideal behaviour of the switches and of the amplifier arrangement the rectified current produced by C-REC will deviate somewhat from the exact rectified current. However, it can be proved that this effect only pushes the ripple on the tuning voltage VTQ to a higher frequency band without having any negative effect on the above gain comparison. As a consequence, this effect rather constitutes an advantage than a disadvantage in the tuning system according to the present invention.

While the principles of the invention have been described above in connection with specific apparatus, it is to be clearly understood that this description is made only by way of example and not as a limitation on the scope of the invention.

We claim:

1. Tuning system for generating a tuning signal (VTQ) to be applied to at least one master tunable filter in order to tune the quality factor of the master tunable filter to substantially equal a desire quality factor value, the tuning system comprising:

a tunable filter which is a replica of the master tunable filter, said tuning signal also being applied to said tunable filter (BIQUAD) in order to tune the quality factor of said tunable filter to substantially equal said desired quality factor value, the damping of said tunable filter being controlled in response to changes in said tuning signal;

means for providing a reference signal;

first means responsive to said reference signal for providing a first output signal (IO1) indicative of said reference signal multiplied by a first gain (Z1);

said tunable filter being responsive to said reference signal for providing a tunable filter output signal (VO) indicative of said reference signal multiplied by the passband gain of said tunable filter;

second means responsive to said tunable filter output signal (VO) for providing a second output signal (IO2) indicative of said tunable filter output signal multiplied by a second gain (Z2);

wherein the ratio of said first gain to said second gain is indicative of a desired gain value, the value of said desired gain value being equal to the value of the passband gain of said tunable filter corresponding to said desired quality factor value; and difference means (CM), responsive to said first and second output signals for providing a tuning system output signal which is a function of the difference of said first and second output signals from which said tuning signal (VTQ) is derived, wherein said tuning signal (VTQ) is provided as negative feedback to said tunable filter to change the magnitude of said passband gain to substantially equal said desired gain value.

2. Tuning system according to claim 1, wherein said difference means (CM) is responsive to the difference between said first and second output signals being indicative of said passband gain being lower/higher than said desired gain value for adjusting said tuning signal (VTQ) so as to respectively increase/decrease said passband gain until it equals said desired gain value.

3. Tuning system according to claim 2, wherein said passband gain is the gain at a reference frequency of said tunable filter, said means for providing a reference signal including signal generator means (LO) generating said reference signal at said reference frequency and wherein said first means includes a first amplifier (B-OTA1).

4. Tuning system according to claim 3, wherein said tunable filter (BIQUAD) is a bandpass filter and wherein said reference frequency is the center frequency of said tunable filter.

5. Tuning system according to claim 3, wherein said second means includes a second amplifier (B-OTA2).

6. Tuning system according to claim 3, wherein said first and second means comprise conversion means for performing a voltage to current conversion, wherein the output currents of said conversion means are further converted to first (IO1) and second (IO2) single ended and rectified currents by respective first (C-REC1) and second (C-REC2) current rectifiers, wherein said difference means is a capacitor (CM), wherein said rectified currents (IO1,IO2) discharge and charge said capacitor (CM), respectively, and wherein the voltage over said capacitor determines said tuning signal (VTQ).

7. Tuning system according to claim 6, wherein said voltage over said capacitor (CM) is applied to a low pass filter (LP) whose output is said tuning signal (VTQ) which is then applied to said tunable filter (BIQUAD) and to the master filter.

8. Tuning system according to claim 5, wherein said first (B-OTA1) and second (B-OTA2) amplifiers are operational transconductance amplifiers, said first (B-OTA1) and second (B-OTA2) amplifiers having a first and a second degeneration impedance (Z), respectively, and wherein transconductances of said first (B-OTA1) and second (B-OTA2) amplifiers are substantially equal to the conductance values of said first and second degeneration impedance (Z), respectively, and wherein said transconductances determine the gains of the corresponding amplifiers.

9. Tuning system according to claim 1, wherein said tunable filter (BIQUAD) includes at least one operational transconductance amplifier (OTA3, OTA5) forming an integrator together with an associated capacitor (C1, C2) coupled to the outputs of said amplifier, wherein the transconductance of said amplifier is so tuned that said integrator (OTA3-C1, OTA5-C2) is tuned to a desired characteristic integrator frequency, and wherein said tunable filter also includes controllable damping resistive means (OTA2, OTA4) connected in parallel to said capacitance (C1, C2) for said controlling the damping of said tunable filter.

10. Tuning system according to claim 9, wherein each of said resistive means (OTA2, OTA4) is also an operational transconductance amplifier, the damping of said tunable filter being controlled via said tuning signal (VTQ) by controlling the transconductance of said operational transconductance amplifier.

11. Tuning system according to claim 10, wherein said resistive means (OTA2, OTA4) is controlled to be a negative resistance.

12. Tuning system according to claim 1, wherein said tunable filter (BIQUAD) comprises:
- outputs (VO);
- an input operational transconductance amplifier (OTA1) having outputs;
- a first capacitance (C1);
- a first damping operational amplifier (OTA2) having inputs and outputs;
- wherein said outputs of said input operation transconductance amplifier (OTA1) are connected to said first capacitance (C1), to said inputs and said outputs of said first damping operational amplifier (OTA2), and to said outputs (VO) of said tunable filter (BIQUAD);
- a first filter operational transconductance amplifier (OTA3) having inputs and outputs;
- wherein said outputs of said first operational transconductance amplifier (OTA2) are further connected to said inputs of said first filter operational transconductance amplifier (OTA3);
- a second capacitance (C2);
- a second damping operational transconductance amplifier (OTA4) having inputs and outputs;
- wherein said outputs of said first filter operational transconductance amplifier (OTA3) are connected to said second capacitance (C2) and to said inputs and said outputs of said second damping operational transconductance amplifier (OTA4);
- a second filter operational transconductance amplifier (OTA5) having inputs and outputs;
- wherein said outputs of said second damping operational transconductance amplifier (OTA4) are connected to said inputs of said second filter operational transconductance amplifier (OTA5) and said outputs of said second filter operational transconductance amplifier (OTA5) are said outputs (VO) of said tunable filter (BIQUAD); and
- wherein said first and second damping operational amplifiers (OTA2, OTA4) are tuned by said tuning signal (VTQ).

13. Tuning system according to claim 6, wherein said first (B-OTA1) and second (B-OTA2) amplifiers are operational transconductance amplifiers with transconductances substantially equal to the conductance values of a first and a second degeneration impedance (Z), respectively, and wherein said transconductances determine the gains of the corresponding amplifiers.

* * * * *